(12) United States Patent
Murakami et al.

(10) Patent No.: US 10,916,483 B2
(45) Date of Patent: Feb. 9, 2021

(54) SEMICONDUCTOR DEVICE

(71) Applicant: Mitsubishi Electric Corporation, Tokyo (JP)

(72) Inventors: Takahiko Murakami, Fukuoka (JP); Mitsunori Aiko, Tokyo (JP); Takaaki Shirasawa, Tokyo (JP); Natsuki Tsuji, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/391,815

(22) Filed: Apr. 23, 2019

(65) Prior Publication Data

US 2019/0252276 A1 Aug. 15, 2019

Related U.S. Application Data

(62) Division of application No. 15/561,076, filed as application No. PCT/JP2015/071200 on Jul. 27, 2015, now Pat. No. 10,304,748.

(51) Int. Cl.
*H01L 23/08* (2006.01)
*H01L 23/48* (2006.01)
(Continued)

(52) U.S. Cl.
CPC .............. *H01L 23/08* (2013.01); *H01L 23/04* (2013.01); *H01L 23/48* (2013.01); *F16B 37/048* (2013.01)

(58) Field of Classification Search
USPC .......................................... 257/739; 438/257
(Continued)

(56) References Cited

U.S. PATENT DOCUMENTS 5,090,919 A * 2/1992 Tsuji .................... H01R 13/405
439/519
5,281,493 A * 1/1994 Jones ................... H01R 11/281
429/179
(Continued)

FOREIGN PATENT DOCUMENTS

JP 50-118369 U1 9/1975
JP 01-127259 U1 8/1989
(Continued)

OTHER PUBLICATIONS

International Search Report issued in PCT/JP2015/071200; dated Oct. 6, 2015.
(Continued)

*Primary Examiner* — Hrayr A Sayadian
(74) *Attorney, Agent, or Firm* — Studebaker & Brackett PC (57) ABSTRACT

An object of the present invention is to provide a semiconductor device having a structure in which a resin hardly enters between an insert electrode and a nut at a time of resin sealing. The semiconductor device according to the present invention includes an insert electrode having an insert hole into which a bolt is inserted from outside, a nut which has a screw hole to be screwed with the bolt and is disposed on an inside of the insert electrode so that the screw hole is communicated with the insert hole, at least one semiconductor element being electrically connected to the insert electrode, and a resin sealing the inside of the insert electrode, the nut, and the at least one semiconductor element, wherein a burr is provided on an outer periphery of a direct contact surface of the nut being in direct contact with the insert electrode.

1 Claim, 9 Drawing Sheets

(51) Int. Cl.
*H01L 23/04* (2006.01)
*F16B 37/04* (2006.01)

(58) Field of Classification Search
IPC .......... H04L 23/48,23/08, 23/04; F16B 37/048
See application file for complete search history.

(56) References Cited

U.S. PATENT DOCUMENTS

| | | | |
|---|---|---|---|
| 5,373,105 A * | 12/1994 | Nagaune | H01L 23/04 174/539 |
| 6,521,983 B1 * | 2/2003 | Yoshimatsu | H01L 25/072 257/678 |
| 8,134,838 B2 * | 3/2012 | Essert | H01L 23/49811 361/730 |

FOREIGN PATENT DOCUMENTS

| JP | H04-127411 U | 11/1992 |
|---|---|---|
| JP | H06-120390 A | 4/1994 |
| JP | 09-283681 A | 10/1997 |
| JP | 63-109014 U1 | 7/1998 |
| JP | 2002-005128 A | 1/2002 |
| JP | 2002-076255 A | 3/2002 |
| JP | 2004-106468 A | 4/2004 |
| JP | 2005-277012 A | 10/2005 |
| JP | 2007-263295 A | 10/2007 |
| JP | 2012-222009 A | 11/2012 |

OTHER PUBLICATIONS

An Office Action; "Notification of Reasons for Refusal," mailed by the Japanese Patent Office dated Feb. 20, 2018, which corresponds to Japanese Patent Application No. 2017-530490 and is related to U.S. Appl. No. 15/561,076; with English Translation.
International Preliminary Report on Patentability issued in PCT/JP2015/071200; dated Feb. 8, 2018.
Merriam Webster OnLine definition of "crush." No Date.
An Office Action dated by the German Patent Office dated Nov. 16, 2020, which corresponds to German Patent Application No. 11 2015 006 738.8 and is related to U.S. Appl. No. 16/391,815.

* cited by examiner

SEMICONDUCTOR DEVICE

CROSS REFERENCE TO RELATED APPLICATIONS

This application is a Divisional Application of U.S. patent application Ser. No. 15/561,076 filed Sep. 25, 2017, which is a U.S. National Stage Entry of PCT/JP2015/071200 filed Jul. 27, 2015, the entire contents of which are incorporated herein by reference.

TECHNICAL FIELD

The present invention relates to a semiconductor device, and particularly to a semiconductor device including an insert electrode to be connected to an external electrode.

BACKGROUND ART

Known as a semiconductor device used as a power module used for a motor control and an inverter of an air conditioner, for example, is a semiconductor device including a heatsink, a heat radiation insulating substrate joined to the heatsink, a semiconductor element disposed on the heat radiation insulating substrate, and an insert electrode for connecting the semiconductor element to an external electrode.

A nut is disposed on an inside of the insert electrode, and a bolt can be screwed from an outside of the insert electrode (that is to say, an outside of the semiconductor device). The inside of the insert electrode, the nut, and the semiconductor element, for example, are sealed with a sealing resin.

When there is a slight gap between the insert electrode and the nut at a time of resin sealing (also referred to as a resin molding), the resin enters the gap. Then, an intrusion of the resin between the insert electrode and the nut occurs after the resin sealing.

The intrusion of the resin between the insert electrode and the nut causes a creeping of the resin at a time of tightening the bolt. The creeping of the resin causes a reduction in axial force while in use or right after tightening the bolt. The reduction in axial force may seriously degrade an assumed quality of the power module. Thus, the prevention of the intrusion of the resin is a significantly important factor in performing the resin sealing.

Known as techniques of temporarily fixing an insert electrode and a nut at a time of resin sealing are a technique of providing a resin plate to tighten a bolt and a technique of temporarily fixing the nut magnetically. However, the above techniques have a problem that an attachment force between the nut and the insert electrode is weak, so that a gap occurs, and a dissolved resin enters the gap. A technique of temporarily fixing a nut in a rotational direction is known (refer to Patent Document 1).

PRIOR ART DOCUMENT

Patent Document

Patent Document 1: Japanese Patent Application Laid-Open No. 2002-5128

SUMMARY

Problem to be Solved by the Invention

However, the conventional technique is focused on the temporal fixing of the nut in the rotational direction, so that it has a problem that the attachment force in an axial direction is weak, and a gap easily occurs between the electrode and the nut.

The present invention has been achieved to solve problems as described above, and it is an object of the present invention to provide a semiconductor device having a structure in which a resin hardly enters between an insert electrode and a nut at a time of resin sealing.

Means to Solve the Problem

A semiconductor device according to the present invention includes an insert electrode having an insert hole into which a bolt is inserted from outside, a nut which has a screw hole to be screwed with the bolt and is disposed on an inside of the insert electrode so that the screw hole is communicated with the insert hole, at least one semiconductor element being electrically connected to the insert electrode, and a resin sealing the inside of the insert electrode, the nut, and the at least one semiconductor element, wherein a burr is provided on an outer periphery of a direct contact surface of the nut being in direct contact with the insert electrode.

The semiconductor device according to the present invention includes an insert electrode having an insert hole into which a bolt is inserted from outside, a nut which has a screw hole to be screwed with the bolt and is disposed on an inside of the insert electrode so that the screw hole is communicated with the insert hole, at least one semiconductor element being electrically connected to the insert electrode, and a resin sealing the inside of the insert electrode, the nut, and the at least one semiconductor element, wherein at least one of the nut and the insert electrode has a press fit structure of being pressed into the other one of the nut and the insert electrode.

The semiconductor device according to the present invention includes an insert electrode having an insert hole into which a bolt is inserted from outside, a nut which has a screw hole to be screwed with the bolt and is disposed on an inside of the insert electrode so that the screw hole is communicated with the insert hole, at least one semiconductor element being electrically connected to the insert electrode, and a resin sealing the inside of the insert electrode, the nut, and the at least one semiconductor element, wherein the insert electrode has a U-shaped part, and in a first part and a second part facing each other in the U-shaped part, the insert hole is provided in the first part, the direct contact surface of the nut is in direct contact with the first part, an end part of the nut on an opposite side of the direct contact surface is in direct contact with the second part, and the nut is pressed between the first part and the second part.

Effects of the Invention

The semiconductor device according to the present invention can achieve the semiconductor device which suppresses the resin entering between the nut and the inside of the insert electrode. Accordingly, the occurrence of the creeping of the resin at the time of tightening the bolt on the insert electrode can be suppressed, thus the semiconductor device having the high reliability can be obtained.

These and other objects, features, aspects and advantages of the present invention will become more apparent from the following detailed description of the present invention when taken in conjunction with the accompanying drawings.

DESCRIPTION OF EMBODIMENT(S)

Embodiment 1

<Configuration>

Figure 1:
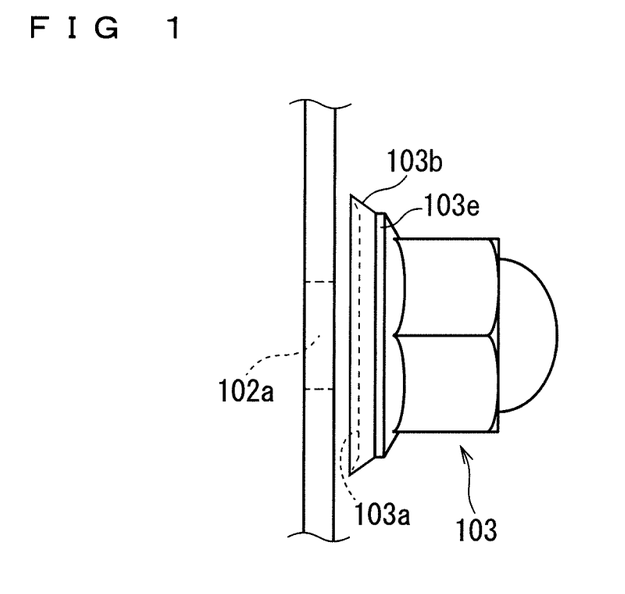
FIG. 1 is an exploded side view of an insert electrode and a nut of a semiconductor device according to an embodiment 1.
Figure 2:
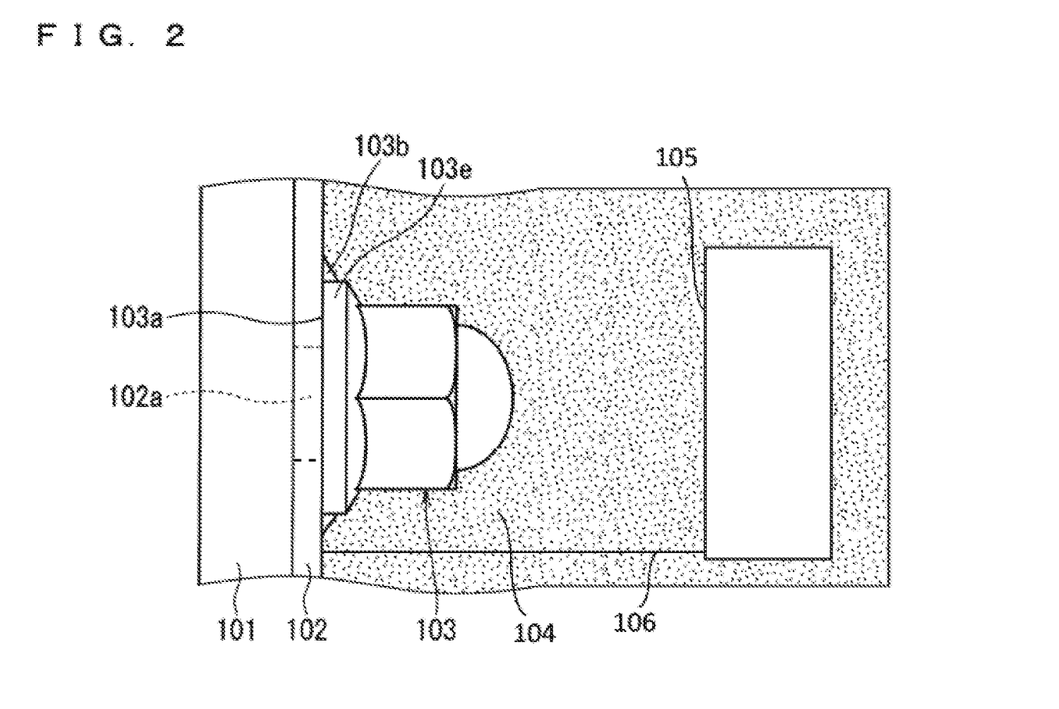
FIG. 2 is a side view of the insert electrode, a semiconductor element, and the nut of the semiconductor device according to the embodiment 1.

FIG. 1 is an exploded side view of an insert electrode 102 and a nut 103 of a semiconductor device according to the present embodiment 1. FIG. 2 is a side view of the insert electrode 102 and the nut 103 of the semiconductor device according to the present embodiment 1.

As illustrated in FIG. 1 and FIG. 2, an insert hole 102a into which a bolt (not shown) is inserted from outside is provided in the insert electrode 102.

A screw hole is provided in the nut 103. As illustrated in FIG. 2, the nut 103 is disposed on an inside of the insert electrode 102 so that the screw hole is communicated with the insert hole 102a.

As illustrated in FIG. 1, the nut 103 is a cap nut (non-penetrating type nut) having a fringe 103e. A bearing surface of the nut 103 (that is to say, a contact surface between the fringe 103e and the insert electrode 102) is defined as a direct contact surface 103a. A burr 103b is seamlessly provided on an outer periphery of the direct contact surface 103a (that is to say, an edge portion of the fringe 103e) of the nut 103. The burr 103b is a flange provided on the outer periphery of the direct contact surface 103a (that is to say, the bearing surface of the nut 103) of the nut 103. As illustrated in FIG. 1, the burr 103b protrudes toward the insert electrode 102 before the resin sealing.

A semiconductor element 105 is electrically connected to the insert electrode 102 via a wire 106, for example. The semiconductor element 105 is solder-joined to an insulating substrate (not shown) in which a metal pattern is formed on both surfaces thereof, for example.

As illustrated in FIG. 2, the inside of the insert electrode 102, the nut 103, and the semiconductor element 105 are sealed with a sealing resin 104. In a state of resin sealing, the burr 103b of the nut 103 is crushed, and the direct contact surface 103a of the nut 103 and the inside of the insert electrode 102 are closely attached to each other.

The nut 103 of the present embodiment 1 is a nut including the fringe 103e, however, a nut which does not include the fringe 103e is also applicable. In this case, the burr 103b is provided on a main body of the nut 103 along the outer periphery of the direct contact surface 103a.

<Manufacturing Method>

As illustrated in FIGS. 1 and 2, firstly, the insert electrode 102, electrically connected to the semiconductor element 105 via wire 106, is disposed on a mold 101. Then, the nut 103 is disposed on the insert electrode 102. At this time, the nut 103 is disposed so that the screw hole of the nut 103 is communicated with the insert hole 102a. Then, the resin 104 is injected inside the mold 101 and is hardened. Accordingly, the inside of the insert electrode 102, the nut 103, and the semiconductor element 105 are sealed with the sealing resin 104. Then, as illustrated in FIG. 2, the burr 103b provided on the outer periphery of the direct contact surface 103a of the nut 103 is crushed. As a result, the crushed burr 103b and the inside of the insert electrode 102 are closely attached to each other.

<Effect>

The semiconductor device according to the embodiment 1 includes the insert electrode 102 having the insert hole 102a into which the bolt (not shown) is inserted from the outside, the nut 103 which has the screw hole to be screwed with the bolt and is disposed on the inside of the insert electrode 102 so that the screw hole is communicated with the insert hole 102a, at least one semiconductor element 105 being electrically connected to the insert electrode 102, and a resin 104 sealing the inside of the insert electrode 102, the nut 103, and the at least one semiconductor element 105, wherein the burr 103b is provided on the outer periphery of the direct contact surface 103a of the nut 103 being in direct contact with the insert electrode 102.

In the semiconductor device according to the present embodiment 1, the burr 103b is provided on the outer periphery of the direct contact surface 103a of the nut 103 to prevent the resin 104 from entering between the insert electrode 102 and the nut 103 in the resin sealing process. Since the burr 103b is pressed to the inside of the insert electrode 102 and crushed at the time of resin sealing, the part where the burr 103b is provided in the nut and the insert electrode 102 are closely attached to each other in an axial direction of the screw hole. That is to say, the occurrence of the gap which the resin 104 enters between the nut 103 and the inside of the insert electrode 102 can be suppressed. Thus, the semiconductor device which suppresses the resin entering between the nut 103 and the insert electrode 102 can be obtained. Accordingly, the occurrence of the creeping of the resin at the time of tightening the bolt on the insert electrode 102 can be suppressed, thus the semiconductor device having the high reliability can be obtained.

Embodiment 2

Figure 3:
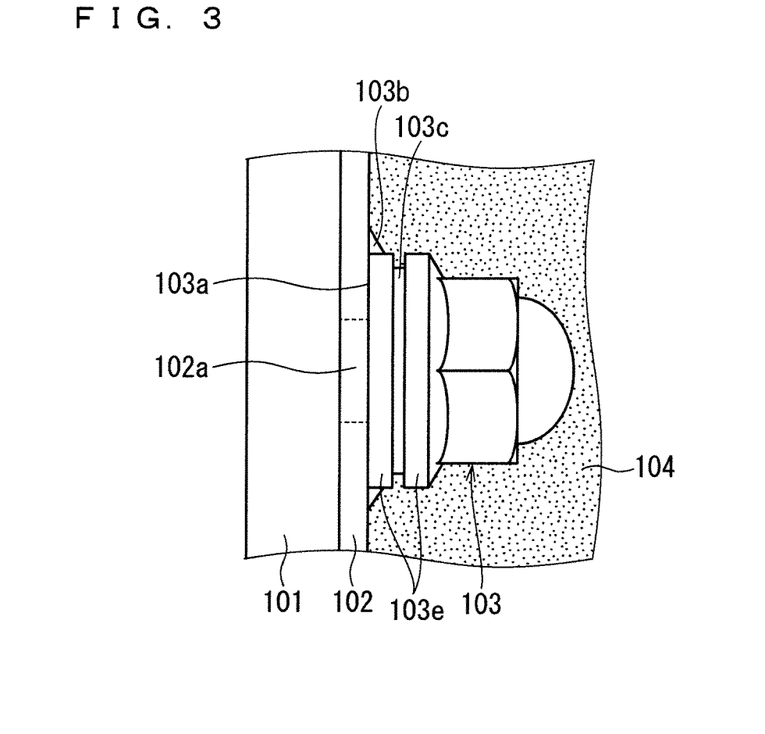
FIG. 3 is a side view of an insert electrode and a nut of a semiconductor device according to an embodiment 2.

FIG. 3 is a side view of the insert electrode 102 and the nut 103 of a semiconductor device according to the present embodiment 2. In the present embodiment 2, a groove 103*c* is provided along the outer periphery of the nut 103 (that is to say, along the outer periphery of the fringe 103*e*). The groove 103*c* is provided in parallel to the direct contact surface 103*a*. The groove 103*c* is preferably provided seamlessly along the outer periphery of the nut 103, but may also be provided on a part of the outer periphery of the nut 103. Although one groove 103*c* is provided in FIG. 3, a plurality of grooves 103*c* may also be provided along the outer periphery of the nut 103.

The nut 103 of the embodiment 2 is a nut including the fringe 103*e*, however, a nut which does not include the fringe 103*e* is also applicable. In this case, the groove 103*c* is provided along the outer periphery of the main body of the nut. Another configuration of the semiconductor device in the present embodiment 2 is the same as the configuration in the embodiment 1, thus the description is omitted.

<Effect>

In the semiconductor device according to the present embodiment 2, the groove 103*c* extending in a direction parallel to the direct contact surface 103*a* is provided along the outer periphery of the nut 103. Since the groove 103*c* is provided, increased is an area in the nut 103 to which the pressured is applied from the resin 104 in a direction which the nut 103 is pressed to the insert electrode 102 (the axial direction of the screw hole). Thus, the nut 103 can be closely attached to the insert electrode 102 more firmly at the time of resin sealing.

Embodiment 3

Figure 4:
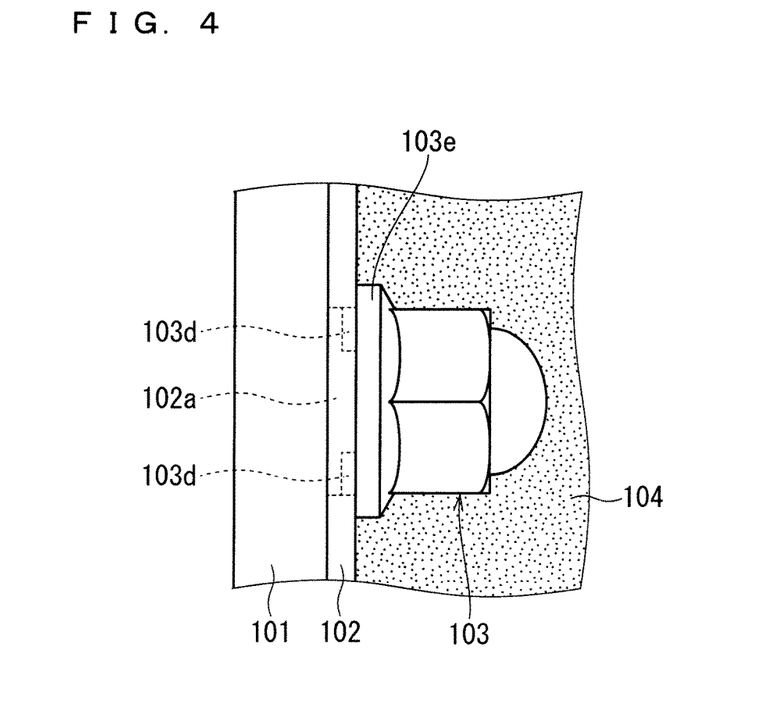
FIG. 4 is a side view of an insert electrode and a nut of a semiconductor device according to an embodiment 3.
Figure 5:
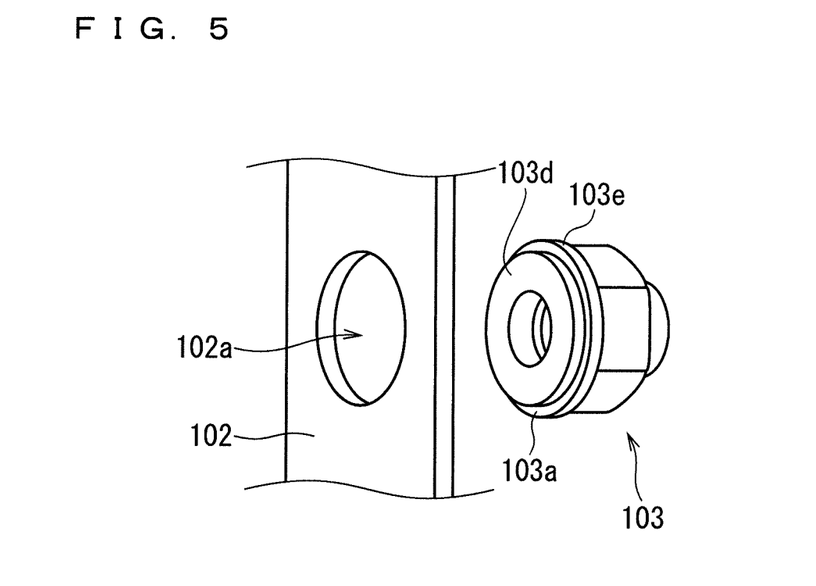
FIG. 5 is an exploded perspective view of the insert electrode and the nut of the semiconductor device according to the embodiment 3.
Figure 6:
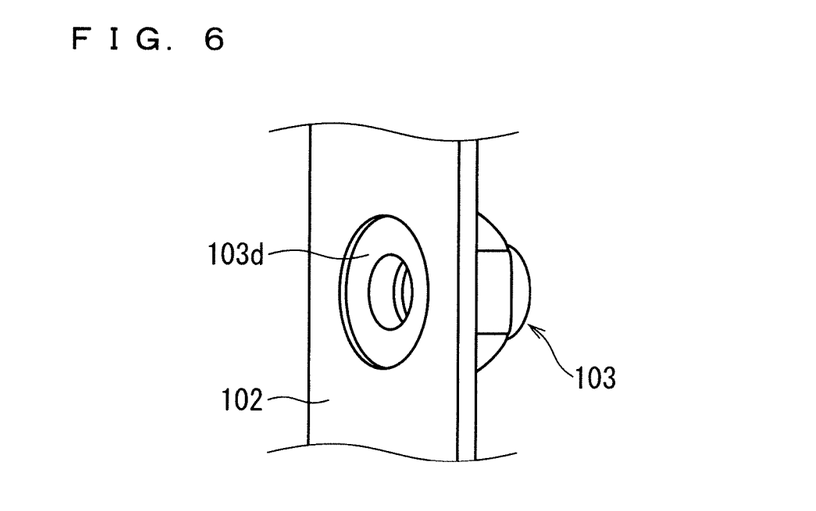
FIG. 6 is a perspective view of the insert electrode and the nut of the semiconductor device according to the embodiment 3.

FIG. 4, FIG. 5, and FIG. 6 are a side view, an exploded perspective view, and a perspective view of the insert electrode 102 and the nut 103 of the semiconductor device according to the present embodiment 3, respectively.

As illustrated in FIG. 4 and FIG. 6, an insert hole 102*a* into which the bolt (not shown) is inserted from the outside is provided in the insert electrode 102. A screw hole is provided in the nut 103. As illustrated in FIGS. 4 to 6, the nut 103 is disposed on the inside of the insert electrode 102 so that the screw hole is communicated with the insert hole 102*a*.

As illustrated in FIG. 4, the nut 103 is a cap nut having the fringe 103*e*. In a manner similar to the embodiment 1, the bearing surface of the nut 103 (that is to say, the contact surface between the fringe 103*e* and the insert electrode 102) is defined as the direct contact surface 103*a*.

As illustrated in FIG. 5, a stepped part 103*d* is provided on the direct contact surface 103*a* (that is to say, the bearing surface of the fringe 103*e*) of the nut 103. The stepped part 103*d* is provided to be concentric with the screw hole of the nut 103 and to surround the screw hole.

Since the stepped part 103*d* as a press fit structure is pressed into the insert hole 102*a*, an inside of the insert hole 102*a* (a side in an inner diameter direction) and an outside of the stepped part 103*d* (a side in an outer diameter direction) are closely attached to each other.

In the manner similar to the embodiment 1, the semiconductor element not shown is electrically connected to the insert electrode 102 via the wire, for example. The semiconductor element is solder-joined to the insulating substrate (not shown) in which the metal pattern is formed on the both surfaces thereof, for example.

As illustrated in FIG. 4, the inside of the insert electrode 102, the nut 103, and the semiconductor element (not shown) are sealed with the sealing resin 104.

The nut 103 of the present embodiment 1 includes the fringe 103*e* and has the stepped part 103*d* on the bearing surface of the fringe 103*e*, however, a nut which does not include the fringe 103*e* is also applicable. In this case, the stepped part 103*d* is provided on the bearing surface of the main body of the nut 103.

<Manufacturing Method>

As illustrated in FIG. 6, firstly, the stepped part 103*d* of the nut 103 is pressed into the insert hole 102*a* of the insert electrode 102. Then, the resin 104 is injected inside the mold 101 and is hardened. Accordingly, the inside of the insert electrode 102, the nut 103, and the semiconductor element (not shown) are sealed with the sealing resin 104.

<Effect>

The semiconductor device according to the present embodiment 3 includes the insert electrode 102 having the insert hole 102*a* into which the bolt (not shown) is inserted from the outside, the nut 103 which has the screw hole to be screwed with the bolt and is disposed on the inside of the insert electrode 102 so that the screw hole is communicated with the insert hole 102*a*, at least one semiconductor element being electrically connected to the insert electrode 102, and a resin 104 sealing the inside of the insert electrode 102, the nut 103, and the at least one semiconductor element, wherein at least one of the nut 103 and the insert electrode 102 has a press fit structure of being pressed into the other one of the nut 103 and the insert electrode 102.

Accordingly, at least one of the nut 103 and the insert electrode 102 has the press fit structure of being pressed into the other one of the nut 103 and the insert electrode 102, thus the nut 103 and the insert electrode 102 can be closely attached to each other with no gap. The resin sealing is performed in a state where the nut 103 and the inside of the insert electrode 102 are closely attached to each other with no gap, thus the semiconductor device which suppresses the resin 104 entering between the nut 103 and the insert electrode 102 can be obtained. Accordingly, the occurrence of the creeping of the resin at the time of tightening the bolt on the insert electrode 102 can be suppressed, thus the semiconductor device having the high reliability can be obtained.

Moreover, in the semiconductor device according to the present embodiment 3, the press fit structure is the stepped part 103*d* concentric with the screw hole provided in the direct contact surface 103*a* of the nut 103, and the stepped part 103*d* of the nut 103 is pressed into the insert hole 102*a*.

Accordingly, the stepped part 103*d* concentric with the screw hole provided in the direct contact surface 103*a* of the nut 103 is provided, and the stepped part 103*d* is pressed into the insert hole 102*a*, thus the nut 103 and the insert electrode 102 can be closely attached to each other with no gap.

Embodiment 4

Figure 7:
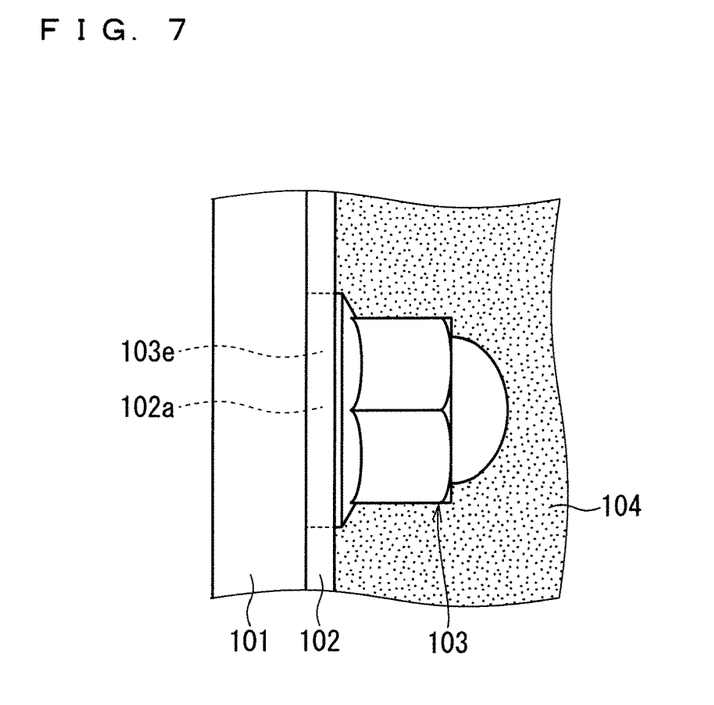
FIG. 7 is a side view of an insert electrode and a nut of a semiconductor device according to an embodiment 4.
Figure 8:
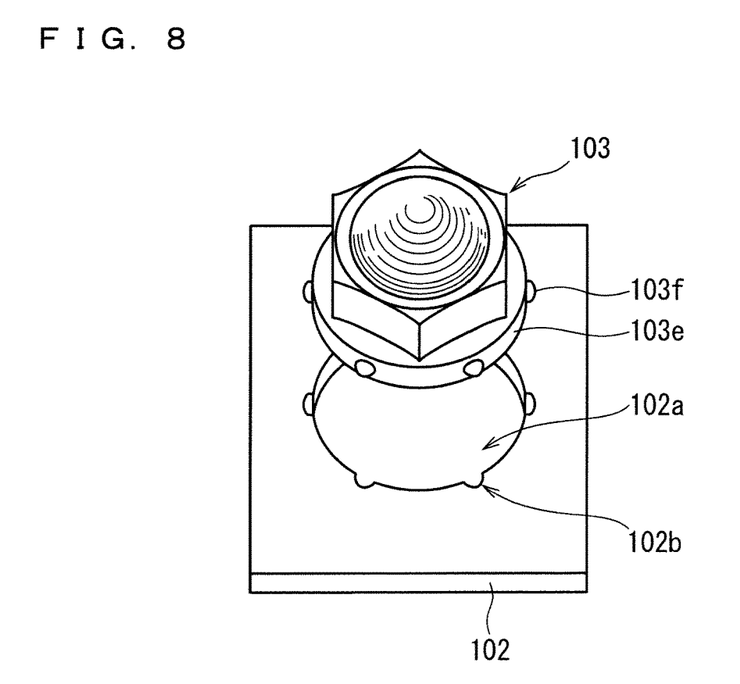
FIG. 8 is an exploded perspective view of the insert electrode and the nut of the semiconductor device according to the embodiment 4 when viewed from an outside of the insert electrode.
Figure 9:
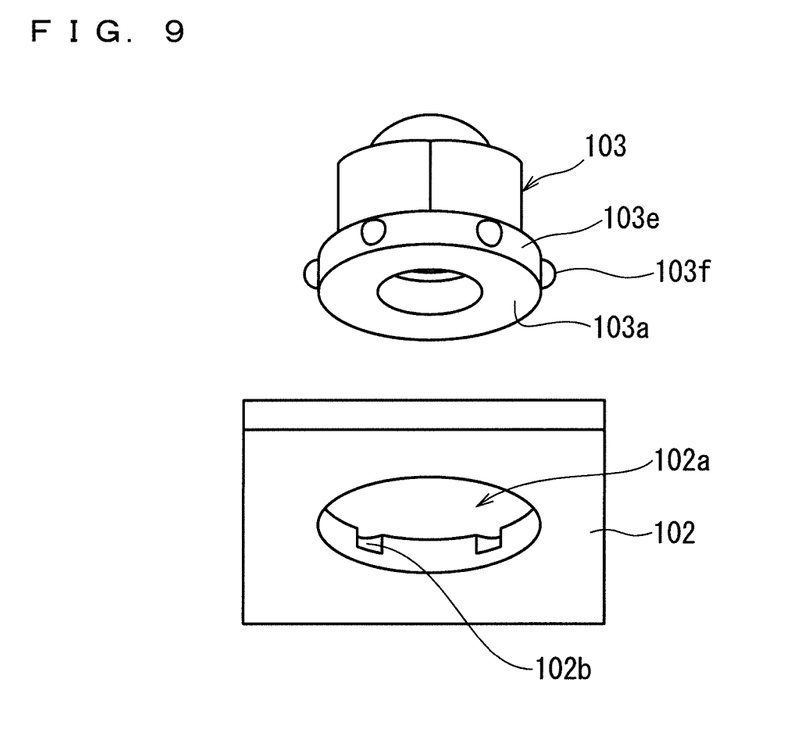
FIG. 9 is an exploded perspective view of the insert electrode and the nut of the semiconductor device according to the embodiment 4 when viewed from an inside of the insert electrode.

FIG. 7, FIG. 8, and FIG. 9 are a side view of the insert electrode 102 and the nut 103 of a semiconductor device according to the present embodiment 4, an exploded perspective view of them viewed from outside of the insert electrode 102, and an exploded perspective view of them viewed from inside of the insert electrode 102, respectively.

In the present embodiment 4, as illustrated in FIG. 8 and FIG. 9, a plurality of protrusions 103f are provided on the outer periphery of the nut 103 (that is to say, the outer periphery of the fringe 103e). An inner diameter of the insert hole 102a of the insert electrode 102 is a size to be fitted with the bearing surface of the nut 103 (the bearing surface of the fringe 103e). A plurality of concave parts 102b are provided on an edge of the insert hole 102a at intervals corresponding to the interval between the plurality of protrusions 103f provided on the nut 103.

Another configuration of the semiconductor device in the present embodiment 4 is the same as the configuration in the embodiment 3, thus the description is omitted.

<Manufacturing Method>

As illustrated in FIG. 8 and FIG. 9, firstly, the fringe 103e of the nut 103 is fitted with the insert hole 102a of the insert electrode 102. At this time, each protrusion 103f of the nut 103 is pressed into each concave part 102b of the insert electrode 102. Then, the resin 104 is injected inside the mold 101 and is hardened. Accordingly, the inside of the insert electrode 102, the nut 103, and the semiconductor element (not shown) are sealed with the sealing resin 104.

<Effect>

In the semiconductor device according to the present embodiment 4, the press fit structure includes the plurality of protrusions 103f provided on the outer periphery of the nut 103 and the plurality of concave parts 102b provided on the edge of the insert hole 102a, and each of the plurality of protrusions 103f is pressed into each of the plurality of concave parts 102b.

In the present embodiment 4, provided on an area of contact between the nut 103 and the insert electrode 102 is the press fit structure that each of the plurality of protrusions 103f is pressed into each of the plurality of concave parts 102b. Accordingly, a close attachment of the nut 103 to the electrode 102 is enhanced. The resin sealing can be performed in the state where the nut 103 and the inside of the insert electrode 102 are closely attached to each other with no gap, thus the semiconductor device which suppresses the resin 104 entering between the nut 103 and the insert electrode 102 can be obtained. Furthermore, when the nut 103 is intended to be fixed to have a specific directional property, the direction of the nut 103 can be defined by a position of the protrusion 103f and the concave part 102b. Thus, a positioning of the nut 103 can be easily performed, and a productivity of the semiconductor device can be enhanced.

Embodiment 5

Figure 10:
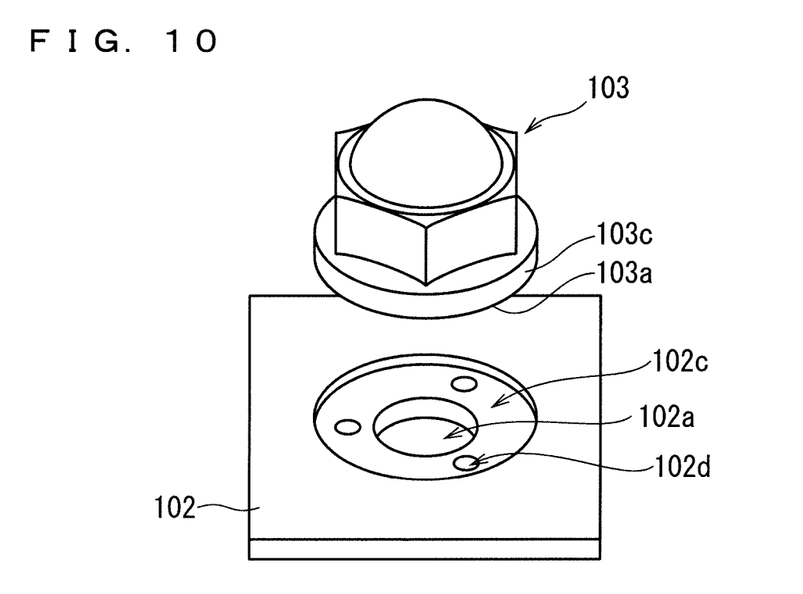
FIG. 10 is an exploded perspective view of an insert electrode and a nut of a semiconductor device according to an embodiment 5 when viewed from the outside of the insert electrode.
Figure 11:
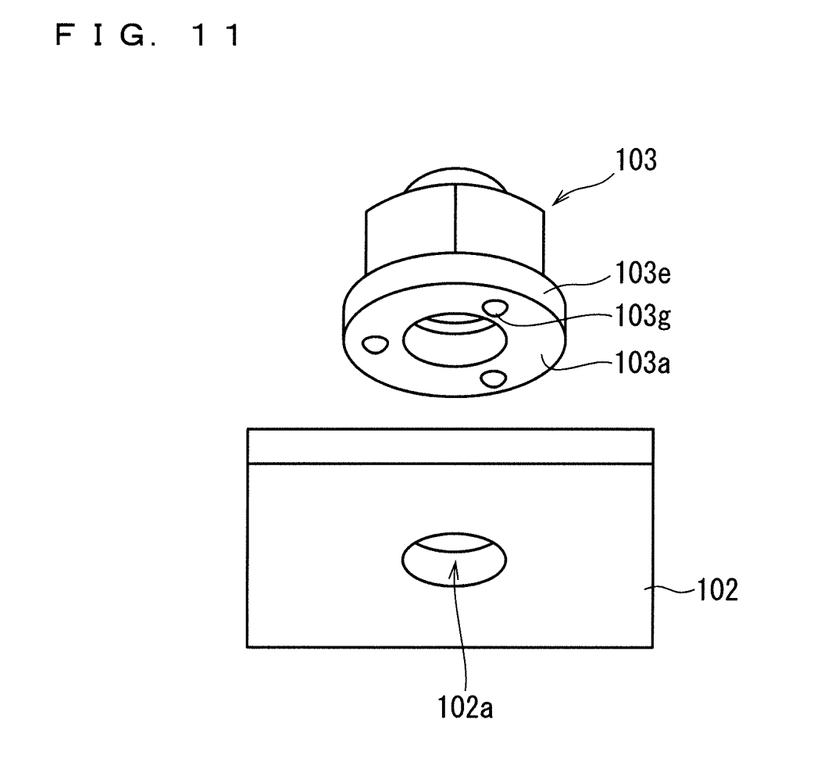
FIG. 11 is an exploded perspective view of the insert electrode and the nut of the semiconductor device according to the embodiment 5 when viewed from the inside of the insert electrode.

FIG. 10 and FIG. 11 are an exploded perspective view of the insert electrode 102 and the nut 103 of a semiconductor device according to the present embodiment 5 viewed from outside of the insert electrode 102, and an exploded perspective view of them viewed from inside of the insert electrode 102, respectively.

In the present embodiment 5, as illustrated in FIG. 10, the stepped part 102c is provided in the inside of the insert electrode 102. The stepped part 102c is one step lower than an inner surface of the insert electrode 102. The stepped part 102c is provided to be concentric with the insert hole 102a. The direct contact surface 103a (that is to say, the fringe 103e) of the nut 103 is pressed into the stepped part 102c. That is to say, the side of the stepped part 102 in the inner diameter direction and the side of the direct contact surface 103a of the nut 103 in the outer diameter direction are closely attached to each other.

A plurality of concave parts 102d are provided in a bottom surface of the stepped part 102c of the insert electrode 102. A plurality of protrusions 103g are provided on the direct contact surface 103a of the nut 103.

Another configuration of the semiconductor device in the present embodiment 5 is the same as the configuration in the embodiment 3, thus the description is omitted.

<Manufacturing Method>

As illustrated in FIG. 10 and FIG. 11, firstly, the fringe 103e of the nut 103 are pressed into the stepped part 102c of the insert electrode 102. At this time, each protrusion 103f provided on the direct contact surface 103a of the nut 103 is pressed into and fitted with each concave part 102d provided in the stepped part 102c of the insert electrode 102. Then, the resin 104 is injected inside the mold 101 and is hardened. Accordingly, the inside of the insert electrode 102, the nut 103, and the semiconductor element (not shown) are sealed with the sealing resin 104.

<Effect>

In the semiconductor device according to the present embodiment 5, the press fit structure has a stepped part 102c which is provided in the insert electrode 102 and into which the direct contact surface 103a of the nut 103 is pressed, the plurality of protrusions 103g provided on the direct contact surface of the nut 103, and the plurality of concave parts 102d provided in the bottom surface of the stepped part 102c of the insert electrode 102 to be fitted with the plurality of protrusions 103g, respectively.

In the present embodiment 5, the stepped part 102c into which the direct contact surface 103a of the nut 103 is pressed is provided in the insert electrode 102 as the press fit structure. This press fit structure enables the close attachment of the nut 103 to the inside of the insert electrode 102 with no gap. Furthermore, when the nut 103 is intended to be fixed to have a specific directional property, a direction of the nut 103 can be defined by a position of the protrusion 103g and the concave part 102d. Thus, the positioning of the nut 103 can be easily performed, and the productivity of the semiconductor device can be enhanced.

Embodiment 6

Figure 12:
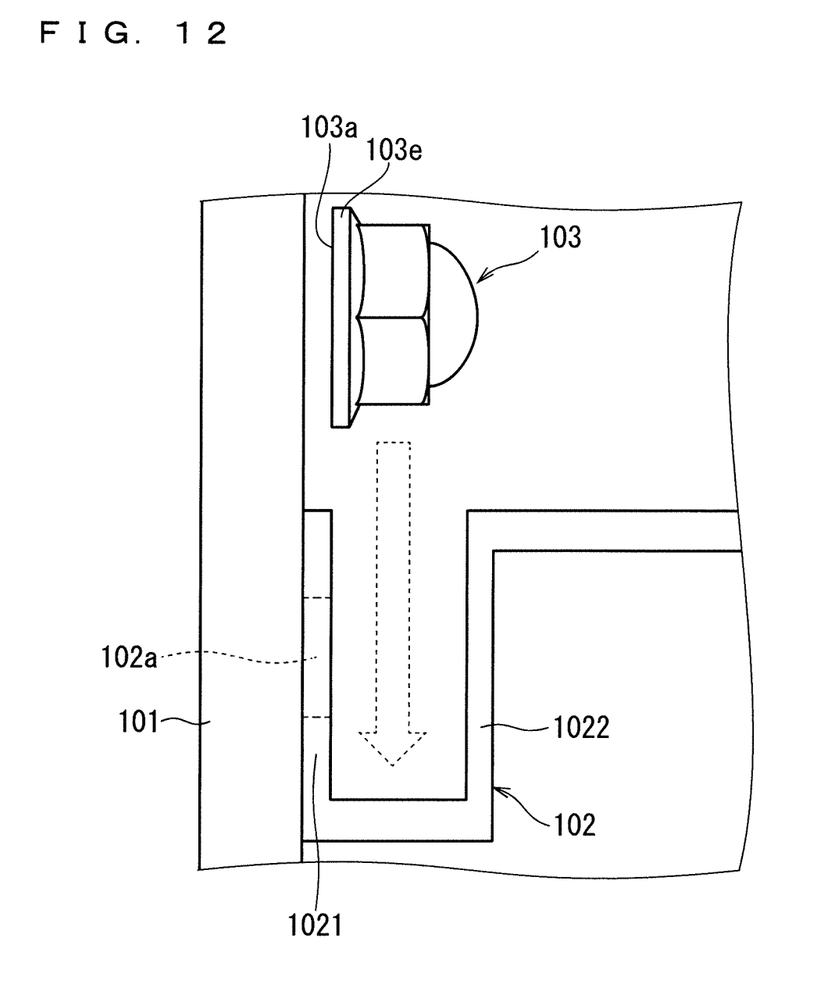
FIG. 12 is an exploded side view of an insert electrode and a nut of a semiconductor device according to an embodiment 6.

FIG. 12 is an exploded side view of the insert electrode 102 and the nut 103 of a semiconductor device according to the present embodiment 6.

As illustrated in FIG. 12, an insert hole 102a into which the bolt (not shown) is inserted from the outside is provided in the insert electrode 102. The screw hole is provided in the nut 103. The nut 103 is disposed on the inside of the insert electrode 102 so that the screw hole is communicated with the insert hole 102a.

As illustrated in FIG. 12, the nut 103 is the cap nut having the fringe 103e. In the manner similar to the embodiment 1, the bearing surface of the nut 103 (that is to say, the contact surface between the fringe 103e and the insert electrode 102) is defined as the direct contact surface 103a.

As illustrated in FIG. 12, the insert electrode 102 has a U-shaped part. The U-shaped part is made up of a first part 1021, a second part 1022 facing the first part, and a part connecting the first part 1021 and the second part 1022. The insert hole 102a are provided in the first part 1021 of the insert electrode 102. In the U-shaped part, a distance between the first part 1021 and the second part 1022 is smaller than a height of the nut 103.

The nut 103 is disposed to be held in the U-shaped part of the insert electrode 102. That is to say, the direct contact surface 103a of the nut 103 is in direct contact with the first part 1021, and an end part of the nut 103 on an opposite side of the direct contact surface 103a (that is to say, a head part of the nut 103) is in direct contact with the second part.

In the U-shaped part, the distance between the first part 1021 and the second part 1022 is smaller than the height of the nut 103, thus the nut 103 is pressed and fixed between the first part 1021 and the second part 1022.

In the manner similar to the embodiment 1, the semiconductor element not shown is electrically connected to the insert electrode 102 via the wire, for example. The semiconductor element is solder-joined to the insulating substrate (not shown) in which the metal pattern is formed on the both surfaces thereof, for example. The inside of the insert electrode 102, the nut 103, and the semiconductor element (not shown) are sealed with the sealing resin 104.

The nut 103 of the present embodiment 1 includes the fringe 103e, however, a nut which does not include the fringe 103e is also applicable. In this case, the bearing surface of the main body of the nut 103 serves as the direct contact surface 103a.

<Manufacturing Method>

As illustrated in FIG. 12, firstly, the insert electrode is disposed on the mold 101. Then, the nut 103 is pressed into the U-shaped part of the insert electrode 102 and is disposed so that the screw hole of the nut 103 is communicated with the insert hole 102a. At this time, the nut 103 is pressed between the first part 1021 and the second part 1022 of the U-shaped part. Then, the resin 104 is injected inside the mold 101 and is hardened. Accordingly, the inside of the insert electrode 102, the nut 103, and the semiconductor element (not shown) are sealed with the sealing resin 104.

<Effect>

The semiconductor device according to the present embodiment 6 includes the insert electrode 102 having the insert hole 102a into which the bolt is inserted from the outside, the nut 103 which has the screw hole to be screwed with the bolt and is disposed on the inside of the insert electrode 102 so that the screw hole is communicated with the insert hole 102a, at least one semiconductor element being electrically connected to the insert electrode 102, and a resin sealing the inside of the insert electrode 102, the nut 103, and the at least one semiconductor element, wherein the insert electrode 102 has the U-shaped part, and in the first part 1021 and the second part 1022 facing each other in the U-shaped part, the insert hole 102a is provided in the first part 1021, the surface of the nut 103 having the screw hole (that is to say, the direct contact surface 103a) is in direct contact with the first part 1021, the end part of the nut 103 on an opposite side of the direct contact surface 103a is in direct contact with the second part 1022, and the nut 103 is pressed between the first part 1021 and the second part 1022.

In the present embodiment 6, the nut 103 is pressed and fixed between the first part 1021 and the second part 1022 of the U-shaped part of the insert electrode 102. Thus, the nut 103 can be closely attached to the insert electrode 102 with no gap. The resin sealing is performed in the state where the nut 103 and the inside of the insert electrode 102 are closely attached to each other with no gap, thus the semiconductor device which suppresses the resin 104 entering between the nut 103 and the insert electrode 102 can be obtained. Accordingly, the occurrence of the creeping of the resin at the time of tightening the bolt on the insert electrode 102 can be suppressed, thus the semiconductor device having the high reliability can be obtained.

Embodiment 7

Figure 13:
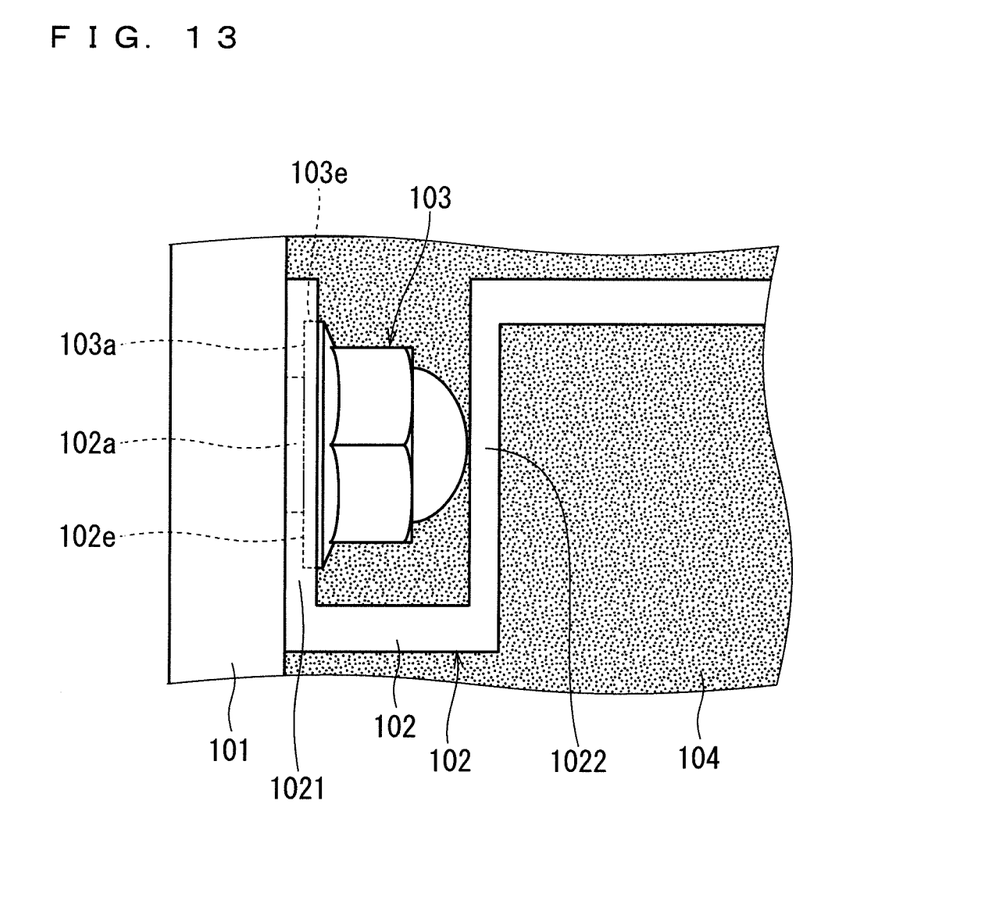
FIG. 13 is a side view of an insert electrode and a nut of a semiconductor device according to an embodiment 7.
Figure 14:
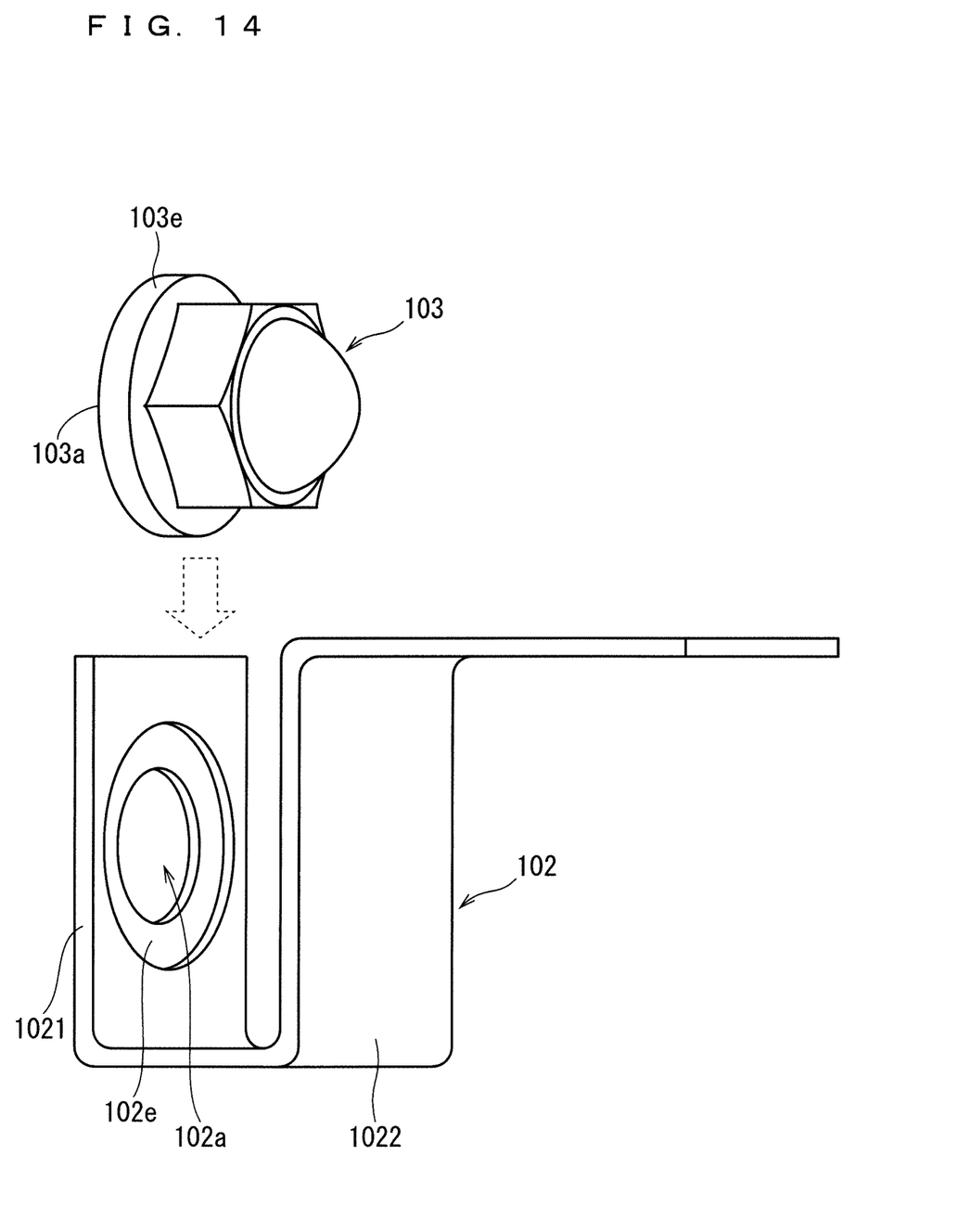
FIG. 14 is an exploded perspective view of the insert electrode and the nut of the semiconductor device according to the embodiment 7.

FIG. 13 and FIG. 14 are a side view and an exploded side view of the insert electrode 102 and the nut 103 of the semiconductor device according to the present embodiment 7, respectively.

In the present embodiment 7, a concave part 102e is further provided in the first part 1021 of the U-shaped part of the insert electrode 102. The insert hole 102a is provided in a bottom part of the concave part 102e. The direct contact surface 103a of the nut 102 is fitted with the concave part 102e of the insert electrode 102.

Another configuration of the semiconductor device in the present embodiment 7 is the same as the configuration in the embodiment 6, thus the description is omitted.

<Effect>

In the semiconductor device according to the present embodiment 7, the concave part 102e is provided in the first part 1021 of the insert electrode 102, and the surface of the nut 103 having the screw hole (that is to say, the direct contact surface 103a) is fitted with the concave part 102e of the insert electrode 102.

In the present embodiment 7, the concave part 102e of the insert electrode 102 and the surface of the nut 103 having the screw hole (that is to say, the direct contact surface 103a) is fitted with each other. Thus, the positioning of the nut 103 can be easily performed at the time of locating the nut 103 in the insert electrode 102. Accordingly, the productivity of the semiconductor device can be enhanced in addition to the effect described in the embodiment 6. Furthermore, the concave part 102e of the insert electrode 102 and the direct contact surface 103a of the nut 103 are fitted with each other, thus an acceptable amount of tolerance increases with respect to a height direction of the nut 103.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 101 mold, 102 insert electrode, 102a insert hole, 102b concave part, 102c stepped part, 102d concave part, 102e stepped part, 1021 first part, 1022 second part, 103 nut, 103a direct contact surface, 103b burr, 103c groove, 103d stepped part, 103e fringe, 103f, 103g protrusion, 104 sealing resin, 105 semiconductor element, 106 wire.

The invention claimed is:

1. A semiconductor device, comprising:
an insert electrode having an insert hole into which a bolt is inserted from outside;
a nut which has a screw hole to be screwed with said bolt and is disposed on an inside of said insert electrode so that said screw hole is communicated with said insert hole;
at least one semiconductor element being electrically connected to said insert electrode, wherein
said nut and said insert electrode are press fit to form a press fit structure, said press fit structure including:
a plurality of protrusions provided on an outer periphery of said nut, and
a plurality of concave parts provided on an edge of said insert hole, and
each of said plurality of protrusions is pressed into a corresponding one of each of said plurality of concave parts; and a resin sealing said inside of said insert electrode, said nut, and said at least one semiconductor element.

\* \* \* \* \*